United States Patent
Liu et al.

(10) Patent No.: US 9,343,573 B2
(45) Date of Patent: May 17, 2016

(54) METHOD OF FABRICATION TRANSISTOR WITH NON-UNIFORM STRESS LAYER WITH STRESS CONCENTRATED REGIONS

(71) Applicant: UNITED MICROELECTRONICS CORP., Hsin-Chu (TW)

(72) Inventors: Chih-Chien Liu, Taipei (TW); Tzu-Chin Wu, Chiayi County (TW); Yu-Shu Lin, Pingtung County (TW); Jei-Ming Chen, Tainan (TW); Wen-Yi Teng, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/557,469

(22) Filed: Dec. 2, 2014

(65) Prior Publication Data
US 2015/0087126 A1 Mar. 26, 2015

Related U.S. Application Data

(62) Division of application No. 13/633,094, filed on Oct. 1, 2012, now Pat. No. 8,937,369.

(51) Int. Cl.
| H01L 29/78 | (2006.01) |
| H01L 21/8234 | (2006.01) |
| H01L 21/324 | (2006.01) |
| H01L 21/02 | (2006.01) |
| H01L 21/768 | (2006.01) |
| H01L 29/66 | (2006.01) |
| H01L 21/8238 | (2006.01) |

(52) U.S. Cl.
CPC ...... *H01L 29/7843* (2013.01); *H01L 21/02164* (2013.01); *H01L 21/324* (2013.01); *H01L 21/76828* (2013.01); *H01L 21/76832* (2013.01); *H01L 21/76834* (2013.01); *H01L 21/823412* (2013.01); *H01L 21/823807* (2013.01); *H01L 21/823864* (2013.01); *H01L 29/6653* (2013.01)

(58) Field of Classification Search
CPC ............ H01L 21/76828; H01L 21/76832; H01L 21/76834; H01L 21/7843; H01L 29/7843
See application file for complete search history.

(56) References Cited

U.S. PATENT DOCUMENTS

| 6,211,083 | B1 | 4/2001 | Yang | |
| 7,053,400 | B2 * | 5/2006 | Sun | H01L 21/823807 257/18 |
| 7,118,999 | B2 * | 10/2006 | Yang | H01L 29/6653 257/E21.444 |
| 7,244,644 | B2 * | 7/2007 | Zhu | H01L 29/7843 257/E21.633 |
| 7,306,983 | B2 | 12/2007 | Chidambarrao | |
| 7,462,915 | B2 * | 12/2008 | Yang | H01L 29/6653 257/369 |

(Continued)

*Primary Examiner* — Fernando L Toledo
*Assistant Examiner* — Christine L Hagan
(74) *Attorney, Agent, or Firm* — Winston Hsu; Scott Margo

(57) ABSTRACT

A method of fabrication a transistor device with a non-uniform stress layer including the following processes. First, a semiconductor substrate having a first transistor region is provided. A low temperature deposition process is carried out to form a first tensile stress layer on a transistor within the first transistor region, wherein a temperature of the low temperature deposition process is lower than 300 degree Celsius (° C.). Then, a high temperature annealing process is performed, wherein a temperature of the high temperature annealing process is at least 150° C. higher than a temperature of the low temperature deposition process. Finally, a second tensile stress layer is formed on the first tensile stress layer, wherein the first tensile stress layer has a tensile stress lower than a tensile stress of the second tensile stress layer.

12 Claims, 10 Drawing Sheets

(56) References Cited

U.S. PATENT DOCUMENTS

| | | | |
|---|---|---|---|
| 7,488,659 B2 | 2/2009 | Dyer | |
| 7,545,002 B2 * | 6/2009 | Maeda | H01L 21/823807 257/292 |
| 7,615,426 B2 * | 11/2009 | Wang | H01L 29/165 257/336 |
| 7,615,432 B2 | 11/2009 | Kim | |
| 7,678,698 B2 | 3/2010 | Bo | |
| 7,713,801 B2 * | 5/2010 | Trivedi | H01L 21/31111 438/154 |
| 7,803,706 B2 * | 9/2010 | Idaka | H01L 21/3105 257/E21.487 |
| 7,838,354 B2 * | 11/2010 | Frohberg | H01L 21/31144 438/199 |
| 7,863,201 B2 * | 1/2011 | Jeong | H01L 21/268 257/368 |
| 7,932,166 B2 * | 4/2011 | Frohberg | H01L 21/3185 257/E21.252 |
| 7,960,764 B2 * | 6/2011 | Idaka | H01L 29/7843 257/288 |
| 7,977,185 B2 * | 7/2011 | Greene | H01L 21/31116 257/E21.01 |
| 2005/0098829 A1 * | 5/2005 | Doris | H01L 21/823807 257/351 |
| 2005/0158955 A1 * | 7/2005 | Yang | H01L 29/6653 438/282 |
| 2006/0118892 A1 * | 6/2006 | Wu | H01L 21/3105 257/412 |
| 2006/0249794 A1 * | 11/2006 | Teh | H01L 21/823864 257/369 |
| 2006/0281272 A1 * | 12/2006 | Yang | H01L 29/6653 438/303 |
| 2006/0286786 A1 * | 12/2006 | Yang | H01L 29/6653 438/586 |
| 2007/0096220 A1 * | 5/2007 | Kim | H01L 21/823412 257/382 |
| 2008/0054415 A1 * | 3/2008 | Frohberg | H01L 21/02164 257/642 |
| 2008/0237726 A1 | 10/2008 | Dyer | |
| 2008/0272411 A1 * | 11/2008 | Bo | H01L 21/268 257/288 |
| 2011/0084320 A1 * | 4/2011 | Jung | H01L 21/28512 257/288 |

* cited by examiner

METHOD OF FABRICATION TRANSISTOR WITH NON-UNIFORM STRESS LAYER WITH STRESS CONCENTRATED REGIONS

CROSS REFERENCE TO RELATED APPLICATIONS

This application is a division of U.S. application Ser. No. 13/633,094, filed Oct. 1, 2012, the disclosure of which is hereby incorporated herein by reference in its entirety.

BACKGROUND OF THE INVENTION

1. Field of the Invention

The present invention relates generally to the field of transistors, and more particularly to a method of fabricating transistor with a non-uniform stress layer.

2. Description of the Prior Art

As semiconductor devices' switching speeds continue to increase and operating voltage levels continue to decrease, the performances of metal-oxide-semiconductor field effect transistors (MOSFETs) and other types of transistors, such as bipolar junction transistors, need to be correspondingly improved. Currently, along with the development of the MOSFETs, one of the main goals is to increase the carriers' mobility so as to further increase the operation speed of the MOSFETs.

In general, a MOSFET is disposed on a semiconductor substrate, which has at least a gate structure, a source region, a drain region separately disposed on two sides of the gate structure and a channel region disposed in the semiconductor substrate right below the gate structure. When a voltage with a certain value is applied to the gate structure, the resistance of the channel region decreases correspondingly, due to the induced capacitance effect and to the carriers that are able to flow between the source region and the drain region freely. In theory, it is well-known that the mobility of carriers flowing in the channel region can be affected by a lattice structure within the channel region. In order to get benefits from this phenomenon, in the current fabrication processes, a stress layer with a certain stress will be formed on a semiconductor substrate to cover a corresponding gate structure, a source region and a drain region. Since the stress layer is able to cover the regions (the gate structure, the source region and the drain region) conformally, the inherent stress within the stress region can be therefore transferred or applied to a channel region right below the gate structure. As a result, the operation speed of a corresponding MOSFET is increased thanks to the enhanced carrier mobility. By way of example, the stress layer within an N-type MOSFET may be a layer with a tensile stress. This tensile stress can enlarge the interstitial space within the lattice structure and raise the carrier mobility of the N-type MOSFET.

With these continuously increasing operation speeds of the MOSFET, the current procedure for fabricating the stress layer reaches its limits. In parts of the N-type MOSFET, in order to further raise the tensile stress applied to the channel region, an inherent tensile stress within the stress layer can be increased by modulating factors for depositing the stress layer. The tensile stress of the stress layer, however, has a maximum value, such as 1.52 Giga pascals (Gpa). Once the tensile stress exceeds this maximum value, the tensile stress layer is likely to fracture and the yield of the corresponding MOSFET is therefore reduced.

Therefore, there is a need to provide a MOSFET and a fabricating method thereof so that the stress of a stress layer can be transferred to a corresponding channel region more effectively without the occurrence of fractures in the stress layer.

SUMMARY OF THE INVENTION

One objective of the present invention is to provide a method of fabrication transistor in order to overcome the drawbacks disclosed above.

To address these and other objectives, according to one embodiment of the invention, a method of fabrication a transistor device with a non-uniform stress layer is provided, which includes the following processes. First, a semiconductor substrate having a first transistor region is provided. The low temperature deposition process is carried out to form a first tensile stress layer on a transistor within the first transistor region, wherein a temperature of the low temperature deposition process is lower than 300 degree Celsius (° C.). Then, a high temperature annealing process is performed, wherein a temperature of the high temperature annealing process is at least 150° C. higher than a temperature of the low temperature deposition process. Finally, a second tensile stress layer is formed on the first tensile stress layer, wherein the first tensile stress layer has tensile stress lower than that of the second tensile stress layer.

According to another embodiment of the present invention, a method of fabrication a transistor with a non-uniform stress layer is also provided. First, a semiconductor substrate having at least a gate structure thereon is provided. A source region and a drain region are separately formed in the semiconductor substrate on two sides of the gate structure. Finally, a first tensile stress layer and a second tensile stress layer are formed respectively, wherein at least a factor for forming the first tensile stress layer is different form a factor for forming the second tensile stress layer, wherein the first tensile stress layer has a transition portion having a thinnest thickness compared to other portions of the first tensile stress layer and a stress of the second stress layer is concentrated on the transition portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
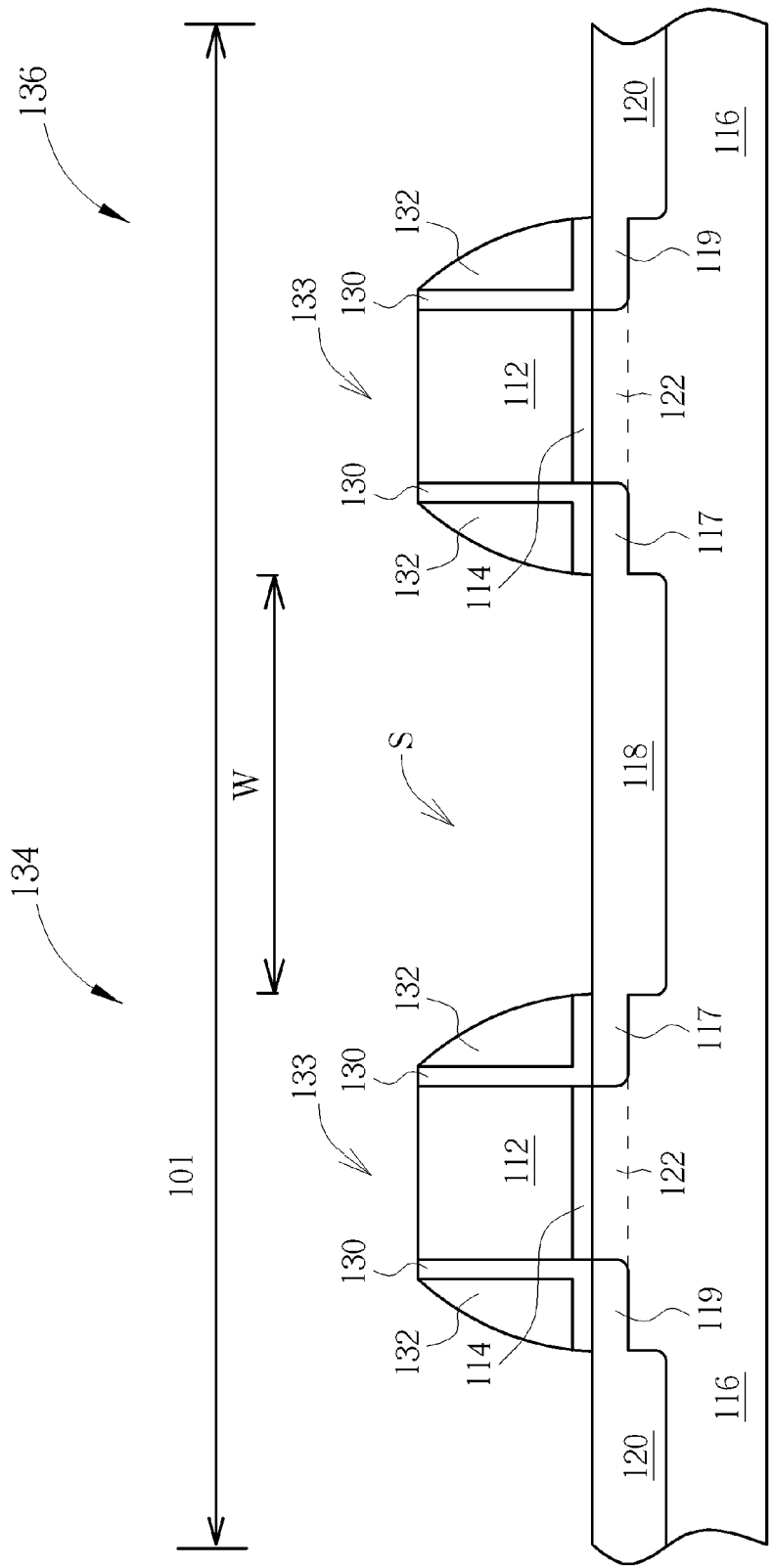
FIGS. 1-5 are schematic diagrams showing a method of fabrication a MOSFET according to a first embodiment of the present invention.

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art. Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof. In addition, in all of the specification, terms like "tensile stress layer" and "compressive stress layer" shall be interpreted based on stress experienced by a certain region, such as a channel region. For example, the "tensile stress layer" should be construed as a layer with a certain inherent characteristic, like a contractive characteristic, which is able to apply a "tensile stress" to a channel region within a transistor device. This "tensile stress layer", however, may induce a "compressive stress" in other non-channel region within the transistor device. For this reason, the actual stress resulting from the "tensile stress layer" and the "compressive stress layer" and receiving by certain regions should be determined by a corresponding description, that is to say, there has no absolute relationship between the "tensile and compressive stress layer" and the "tensile and compressive stress".

Please refer to FIGS. 1-6. FIGS. 1-6 are schematic cross-sectional diagrams illustrating a method of fabricating MOSFETs in accordance with a first preferred embodiment of the present invention, wherein some lithographic and etching processes relating to the present invention method are known in the art and thus are not explicitly shown in the drawings. The present invention can be applied to MOSFETs with planar or non-planar structure, which may be fabricated by processes like gate-first, gate last, HK-first or HK-last processes, but not limited thereto. In addition, the present invention may also apply to other types of transistor devices, such as monopolar transistor devices or bipolar transistor devices, but not limited thereto.

As shown in FIG. 1, a semiconductor substrate 116 is prepared. The semiconductor substrate 116 may be a silicon-containing substrate or a silicon-on-insulator (SOI) substrate, but not limited thereto. A first transistor region 101 is defined in the semiconductor substrate 116, wherein at least two N-type MOSFETs are formed in the first transistor region 101 and an insulating structure, such as a shallow trench insulation (STI) 115 is located between the two MOSFETs, but is not limited thereto. In another case, the first transistor region 101 may include at least one N-type MOSFET, at least one P-type MOSFET and insulating structure. Additionally, the semiconductor substrate 116 may further include a second transistor region 102, which will be described at the end of this article.

In the procedure of fabricating the MOSFET, a gate dielectric layer 114 and a gate electrode 112 positioned on the gate dielectric layer 114 are formed on the semiconductor substrate 116 in the first transistor region 101. Each gate dielectric layer 114 and the corresponding gate electrode 112 can form a gate structure 133. The gate electrode 112 generally includes conductive materials, such as doped polysilicon, metal silicate or the like, and the gate dielectric layers 114 may be made of high-k materials, such as silicon dioxide or silicon nitride. A shallow-junction source extension 117 and a shallow-junction drain extension 119 are thereafter formed on the opposite sides of each gate electrode 112 within the semiconductor substrate 116, where each source extension 117 and the corresponding drain extension 119 are separated by a channel region 122 of a MOS transistor 134 or a MOS transistor 136. It should be noted that, in order to let a stress layer deposited in the following processes have a required morphology, preferably, there is a gap S between the two adjacent gate structures 133, which has a width W smaller than 100 nanometer (nm). Besides, there is preferably no shallow trench isolation (STI) within this gap S.

After the above processes, a liner 130 and a spacer 132 are formed on each sidewall of each of the gate electrodes 112 by performing chemical vapor deposition (CVD) processes and etching processes repeatedly. Each of the liners 130 is positioned around the sidewall of each gate electrode 112, and each of the spacers 132 is positioned on the sidewall of the corresponding liner 130. The liners 130 are typically L shaped and may include silicon oxide, and the spacers 132 may be single-layered structures or multi-layered structures including a silicon nitride compound or a silicon oxide compound. After the formation of the spacers 132, at least an ion implantation process is carried out to implant dopants into the semiconductor substrate 116. Thus, a source region 118 and a drain region 120 are formed in the semiconductor substrate 116 on two sides of each gate structure 112 within the first transistor region 101.

Figure 2:
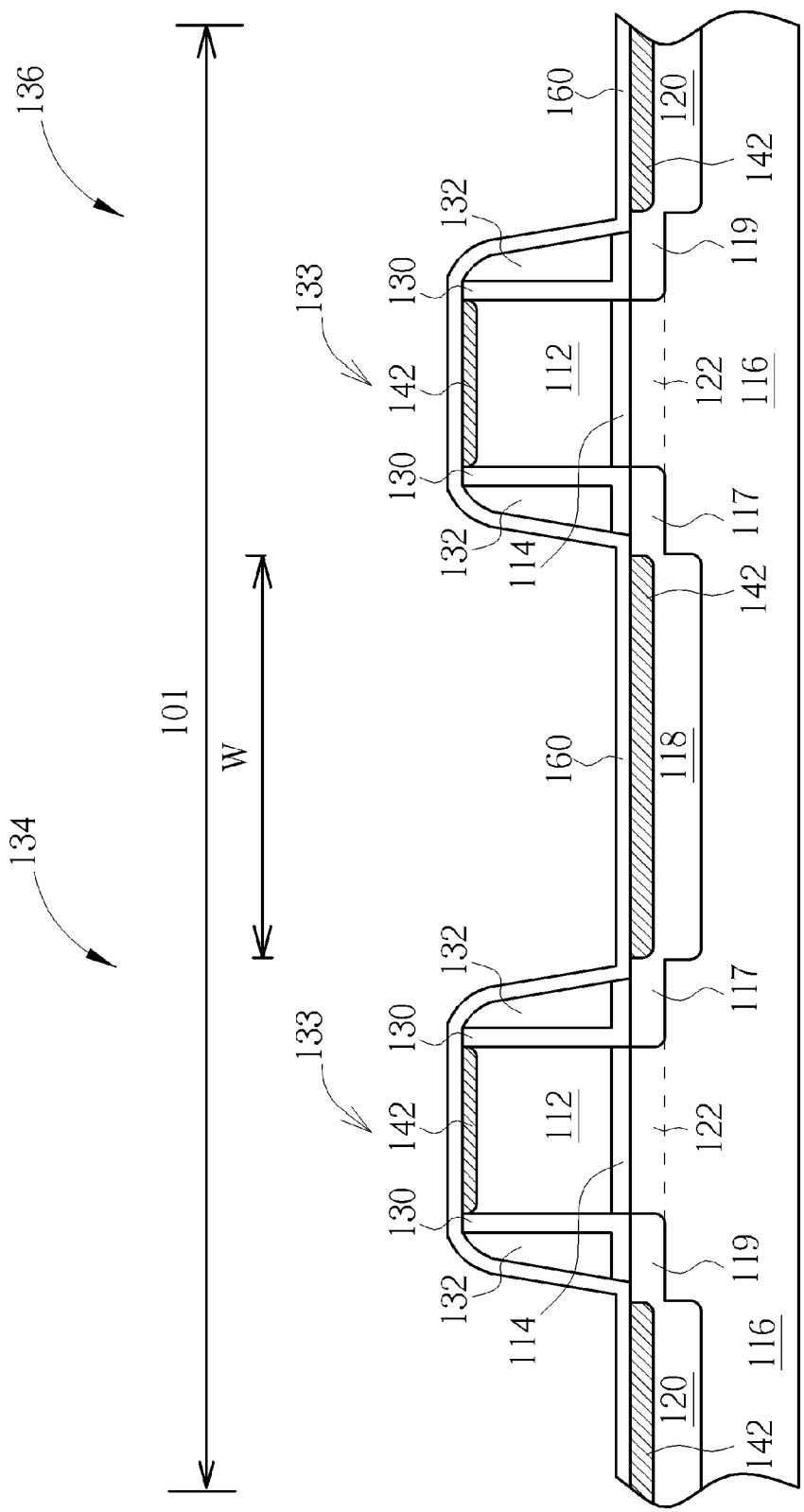

As shown in FIG. 2, in order to let a later deposited stress layer have a required gradually thinning morphology, a thinning process may be optionally carried out on the spacers 132 so that the exterior sidewalls of each spacer 132 can be relatively perpendicular to the semiconductor substrate 116 compared to the original shape. Furthermore, the spacers 132 may also be removed completely. This thinning process may include dry etching processes or wet etching processes and is preferably chosen from dry etching processes. Then, a self-aligned silicidation process is carried out to form a metal silicide layer 142 respectively on the gate electrode 112, the source region 118 and the drain region 120 within the first transistor region 101. In addition, the self-aligned silicidation process may include several steps, such as depositing a metal layer, forming metal silicide compounds and removing the metal layer. Still, according to another embodiment, the time to perform the self-aligned silicidation process may be earlier than the time to thin the spacers 132. Since these steps are well-known to the person skilled in the art, detailed description of these steps is therefore omitted for the sake of clarity.

In order to enhance the adhesivity between the subsequent silicon nitride stress layer and the semiconductor substrate 116, a lining layer can be formed on the surface of the semiconductor substrate 116 before the deposition process of the stress layer. As shown in FIG. 2, a lining layer 160, like a silicon oxide layer, can be conformally formed on the surface of the semiconductor substrate 116 through a deposition process to encompass each of the gate structures 133 (including the gate electrodes 112 and the spacers 132) and to cover the semiconductor substrate 116 in proximity of the spacers 132 of the gate structures 133. The processes for forming the lining layer 160 may include a CVD process or a high temperature oxidation process, but are not limited thereto. It is worth noting that, since the lining layer 160 is not a necessary element for the present invention, and the process of forming the lining layer 160 can be omitted if required.

Figure 3:
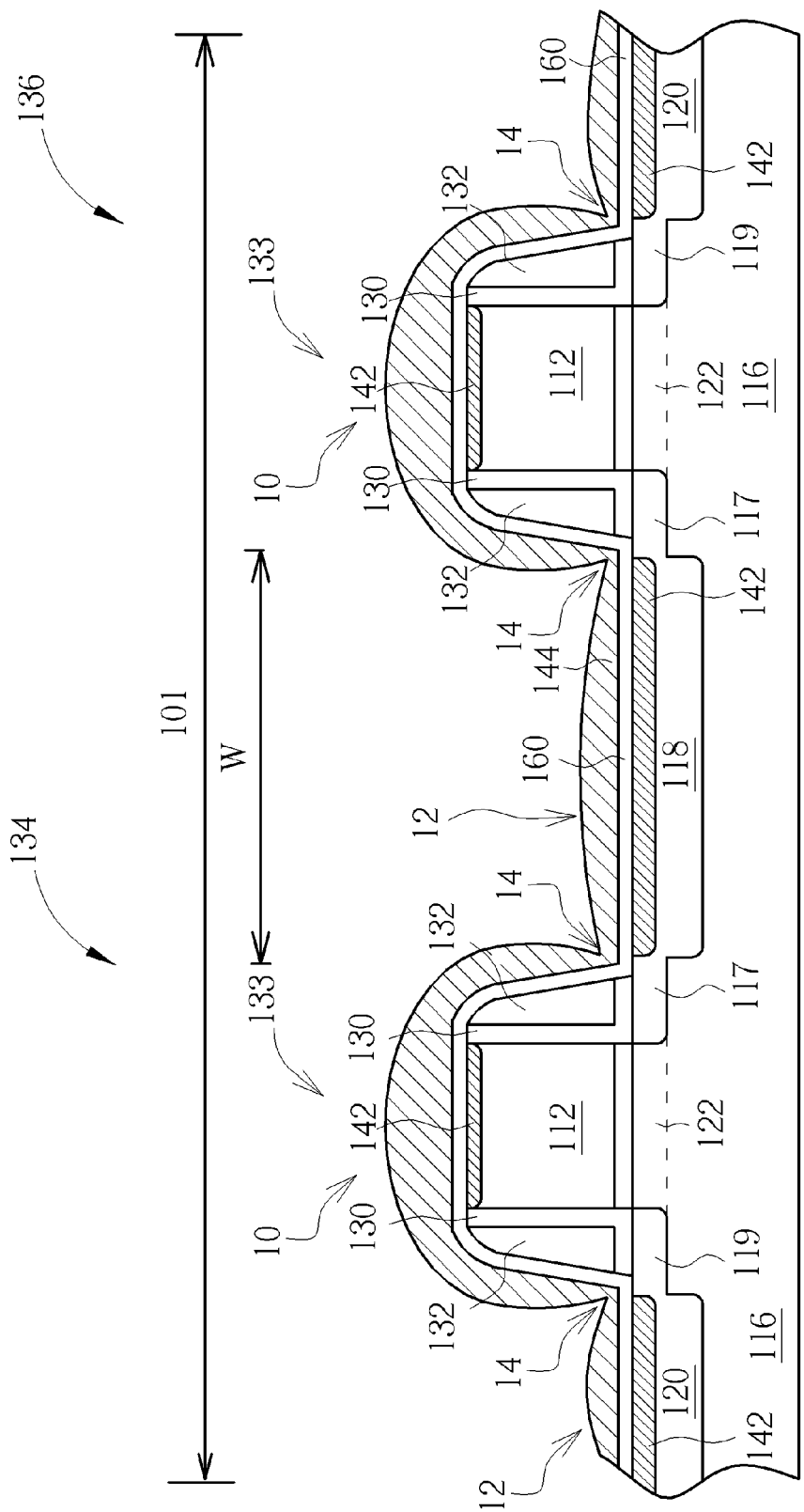

As shown in FIG. 3, a first tensile stress layer 144 is formed on the surface of the semiconductor substrate 116 within the first transistor region 101 by applying a low temperature deposition process with predetermined conditions of temperature, pressure and gas flow rate. The first tensile stress layer 144 can encompass each of the gate structures 133 (including the spacers 132 and the metal silicide layer 142) and to cover the semiconductor substrate 116 at sides the gate structures 133. Since a gap width W between the two adjacent gate structures 133 is preferably narrower than 100 nm, the first tensile stress layer 144 preferably has a thickness that is not completely uniform. For example, the first tensile stress layer 144 near an interface region between two sides of each of the gate structures 133 and the semiconductor substrate 116 has an average thickness thinner than the first tensile stress layer 144 right above each of the gate structures 133. Because the first tensile stress layer 144 may be a silicon nitride layer and is able to impose a tensile stress on the corresponding channel regions 122, the carrier mobility within the carrier regions 122 is therefore raised by this tensile stress. According to preferred embodiments of the present invention, a thickness of the first tensile stress layer 144 is preferably between 5 Angstroms to 90 Angstroms, more preferably between 5 Angstroms to 20 Angstroms. Furthermore, the temperature of the low temperature deposition process is preferably lower than 300° C., and more preferably ranges from 200° C. to 300° C. in order to forma loose stress layer. The method for forming the first tensile stress layer 144 may include various kinds of deposition processes, such as a plasma-enhanced chemical vapor deposition (PECVD) process, a sub-atmospheric pressure chemical vapor deposition (SACVD) process, or a high-density plasma chemical vapor deposition (HDCVD) process and so forth.

After the low temperature deposition process, according to a first embodiment of the invention, a high temperature annealing process is performed in order to remove the hydrogen bonds inside the first tensile stress layer 144 and therefore densify the original loose structure. According to one embodiment of the present invention, there is a predetermined temperature difference between the low temperature deposition process and the high temperature annealing process. For example, when the temperature of the low temperature deposition process ranges from 200° C. to 300° C., the temperature of the high temperature annealing process is preferably at least 150° C. higher than that of the low temperature deposition process, and more preferably approximately 150° C. higher that of the low temperature deposition process. As a result, through this high temperature annealing process ranging from 350° C. to 450° C., the thickness of the densified first tensile stress layer 144 is therefore reduced compared to that of the original loose first tensile stress layer 144. Accordingly, the gradually thinning characteristic of the first tensile stress layer 144 is enhanced.

Figure 4:
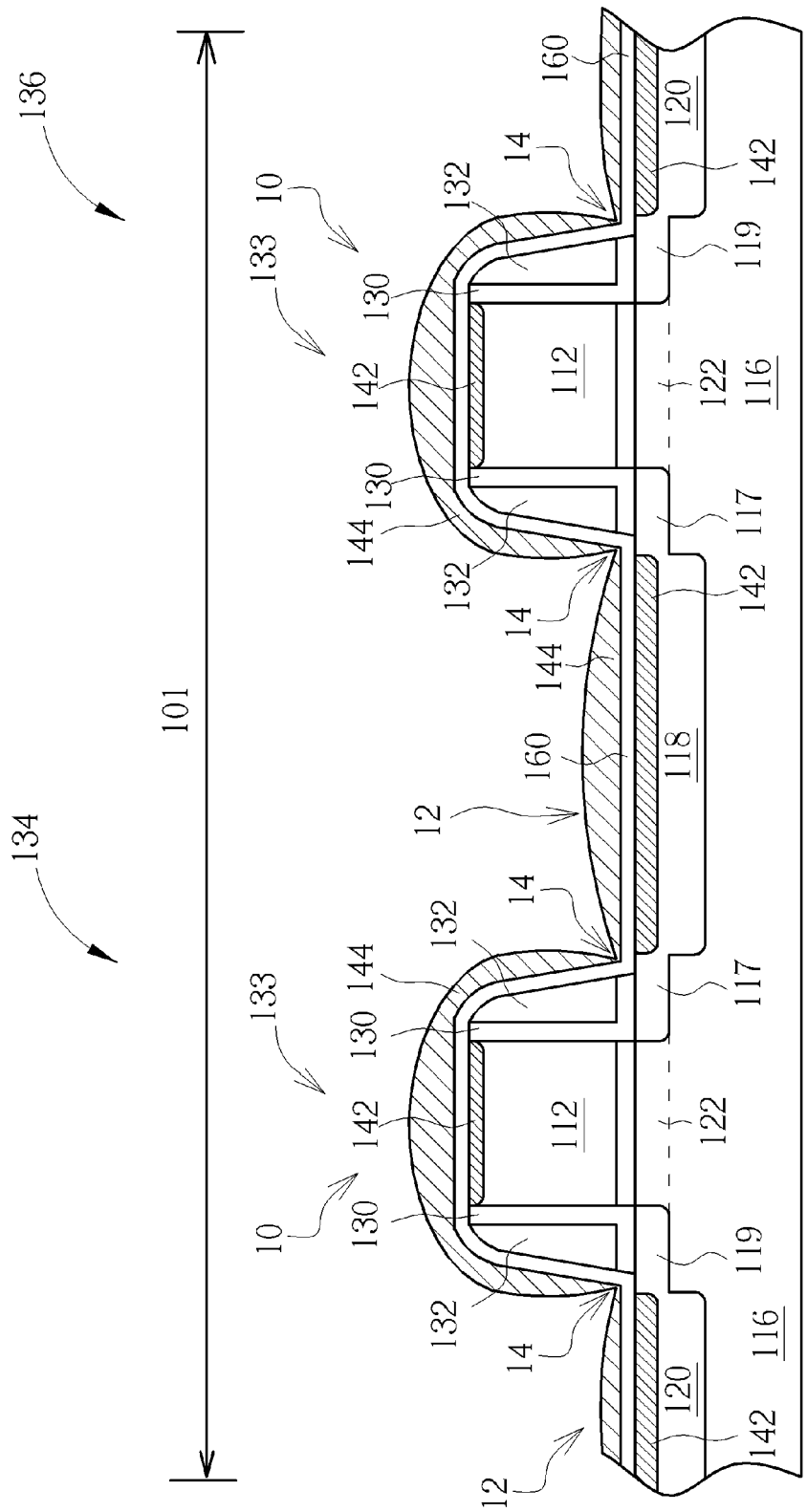

Please refer to FIG. 4. According to one embodiment of the present invention, for example, the first tensile stress layer 144 after the above-mentioned high temperature annealing process includes a curved portion 10 encompassing each of the gate structures 133, at least an extension portion 12 located on the semiconductor substrate 166 at sides of the gate structures 133, and a transition portion 14 between the curved portion 10 and the extension portion 12, wherein the first tensile stress layer 144 has a thickness gradually thinner from the curved portion 10 and the extension portion 12 up to the transition portion 14. One feature of the present invention is that the transition 14 has a relatively thin thickness compared to other portion of the first tensile stress layer 144, which can be obtained by applying a certain temperature difference between the low temperature deposition process and the high temperature annealing process. That is to say, the first tensile stress layer 144 is a non-uniform thin layer. In the subsequent fabricating process, if other layers with certain tensile stress values are formed and cover the first tensile stress layer 144, the corresponding tensile stress may be concentrated on the transition portion 14, or also-called stress concentrated region, as a result. Furthermore, since the transition portion 14 is at two ends of each of the channel regions 122, the direction of net stress suffered by each of the channel regions 122 can be almost parallel to that of the channel regions 122 so that the interstitial space in the channel regions 122 can be enlarged more effectively. In comparison with the conventional technique, the present invention provides a useful way where tensile stress from the stress layer can be transferred to the channel regions 122 more effectively.

Figure 5:
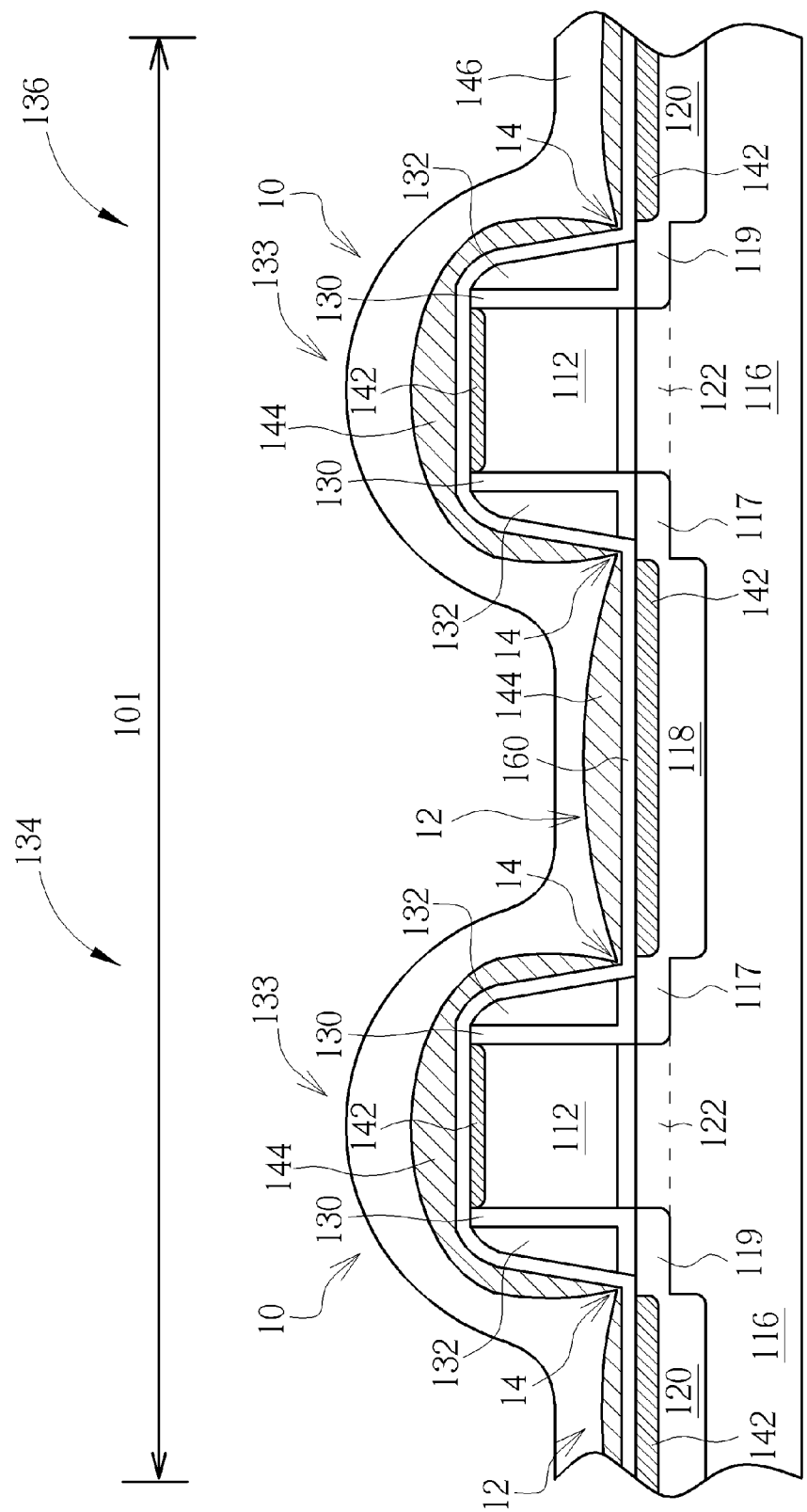

As shown in FIG. 5, a second tensile stress layer 146 is then formed on the first tensile stress layer 144 through a deposition process and at least an annealing process. In accordance with one aspect of the present invention, the second tensile stress layer 146 can be a single-layer structure that includes silicon nitride. Similarly, the second tensile stress layer 146 is able to apply a tensile stress to the channel regions 122 in order to increase the carrier mobility. According to one embodiment of the resent invention, at least a factor for forming the first tensile stress layer 144 is different from a factor for forming the second tensile stress layer 146, such as pressure, temperature, gas concentration or depositing power. It should be noted that, the factor described above preferably excludes certain processing time, such as deposition duration time duration. Additionally, the average thickness and the tensile stress value of the second tensile stress layer 146 are preferably larger than those of the first tensile stress layer 144. Since the first tensile stress layer 144 has a thickness gradually thinning from the curved portion 10 and the extension portion 12 to the transition portion 14, a tensile stress resulting from the second tensile stress layer 146 may be concentrated on the transition portion 14, or also-called stress concentrated region, wherein the stress concentrated regions are located on two sides of a lower portion of each of the gate structures 133. Furthermore, since the transition portion 14 has a relatively thin thickness, according to natural properties of dynamics, the tensile stress obtained by the channel regions 122 can therefore be increased even though the second tensile stress layer 146 has a constant tensile stress compared to the conventional technique. The thickness of the second tensile stress layer 146 preferably ranges from 20 angstrom to 600 angstrom. In addition, the deposition process for forming the second tensile stress layer 146 may include a plasma-enhanced chemical vapor deposition process, a sub-atmospheric pressure chemical vapor deposition process or a high-density plasma chemical vapor deposition process and so forth. The first tensile stress layer 144 and the second tensile stress layer 146 can be formed in the same apparatus or in different apparatuses. According to another embodiment of the present invention, there may be a buffer or an adhesive layer, like a silicon oxide layer, between the second tensile stress layer 146 and the first tensile stress layer 144 in order to enhance the corresponding adhesive property, but not limited thereto. In addition, the buffer or the adhesive layer may slightly counteract the tensile stress imposed on the transition portion 14.

Figure 6:
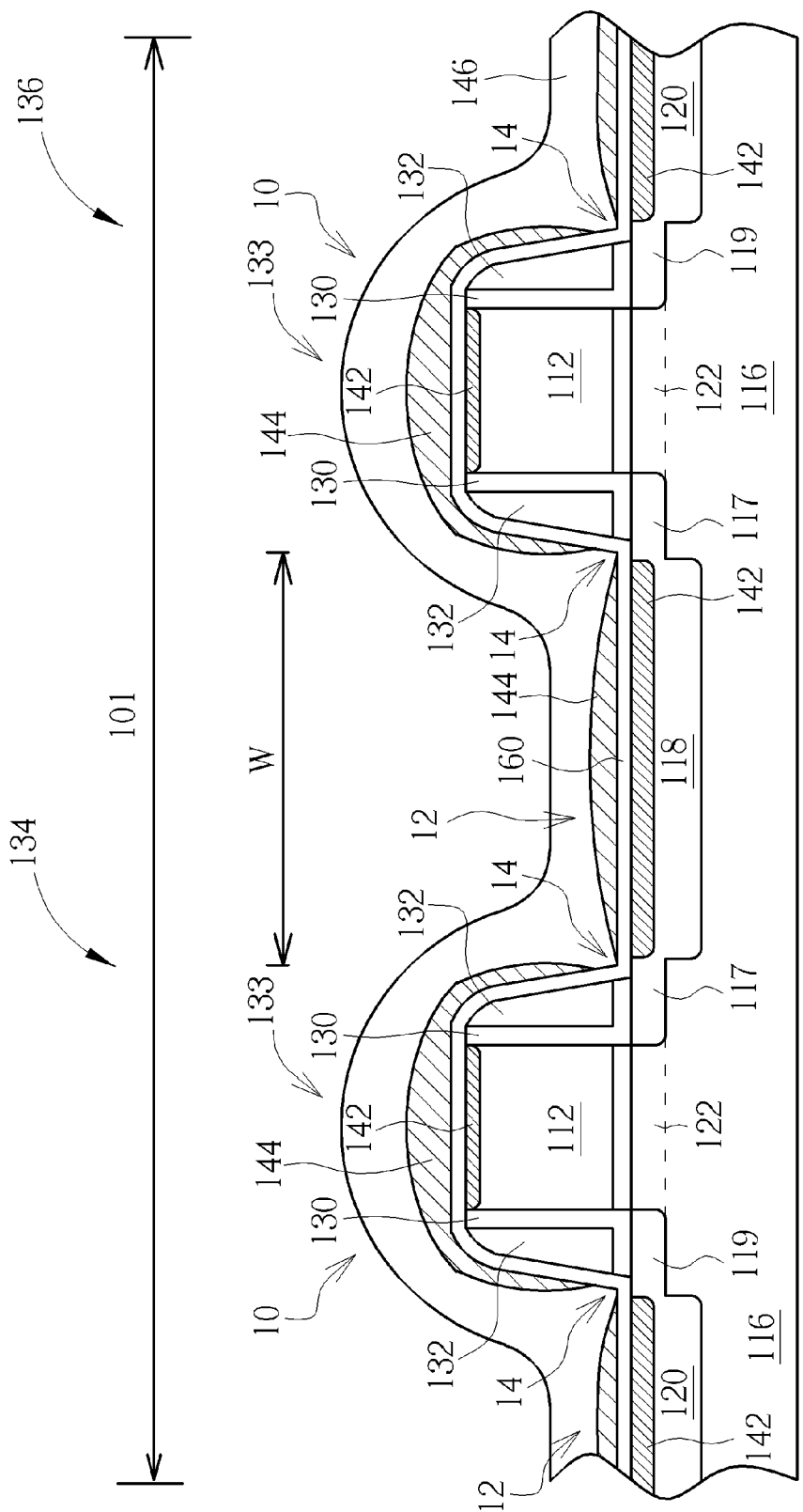
FIG. 6 is schematic cross-sectional diagram showing a MOSFET according to a second embodiment of the present invention.

According to the first embodiment described above, the first tensile stress layer 144 is gradually thinning from each of the curved portions 10 and the extension portions 12 toward the corresponding transition portions 14, wherein the transition portions 14 are continuous layers. According to another embodiment of the resent invention, the first tensile stress layer 144 may be a non-continuous layer broken at the transition portions 14. In this way, a portion of the second tensile stress layer 146 can be in direct contact with a portion of another layer exposed from the first tensile stress layer 144. The detailed description of the second embodiment is described as below. As shown in FIG. 6, the first tensile stress layer 144 in this embodiment also undergo a low temperature deposition process and a high temperature annealing process. Before the performance of the high temperature annealing process, the first tensile stress layer 144 is a thin layer with a non-uniform thickness and its thickness is gradually thinning from each of the curved portions 10 and the extension portions 12 toward the corresponding transition portions 14. However, due to the characteristic of various materials, like the percentage of the hydrogen bonds, or the related fabricating parameters, such as the temperature and the likes, the first tensile stress layer 144 is broken at the transition portions 14 after a high temperature annealing process. As a result, the second tensile stress layer 146 can be in direct contact with a portion of the lining layer 160 underlying the first tensile stress layer 144. According to another embodiment, if there has no lining layer 160 under the first tensile stress layer 144, the second tensile stress layer 146 can directly contact a portion of the spacers 132. Furthermore, in a case with no spacers 132, the second tensile stress layer 146 can further directly contact a portion of the liner 130 or the gate electrode 112, if required. Since the remaining fabricating processes in the second embodiment are almost the same as those described in the first embodiment, their description is therefore omitted for the sake of clarity.

In addition, according to another embodiment of this invention, the second tensile stress layer 146 can be a multi-layered structure. Please refer to FIG. 7. The main characteristic distinguishing the second embodiment from the first embodiment is that the second tensile stress layer 246 in the second embodiment includes a plurality of sub-stress layers, such as a stack structure containing a silicon nitride layer 264 and a silicon nitride layer 265 thereon. Preferably, the tensile stress of each of the sub-stress layers within the second tensile stress layer 246 may gradually increase from the bottom to the top, but is not limited thereto. Additionally, similarly to the above embodiment, a buffer layer or an adhesive layer, like silicon oxide for example, may be disposed between the second tensile stress layer 246 and the first tensile stress layer 144 (the buffer or the adhesive layer may slightly counteract the tensile stress imposed on the transition portion). In this way, the second tensile stress layer 246 may adhere to the first tensile stress layer 144 more tightly, but is not limited thereto. The silicon nitride layer 264 and the silicon nitride layer 265 can be formed by a chemical deposition process, such as a plasma-enhanced chemical vapor deposition (PECVD), a sub-atmospheric pressure chemical vapor deposition (SACVD), or a high-density plasma chemical vapor deposition (HDCVD), and an activating process can be performed on the silicon nitride layer 264 and/or on the silicon nitride layer 265.

Figure 7:
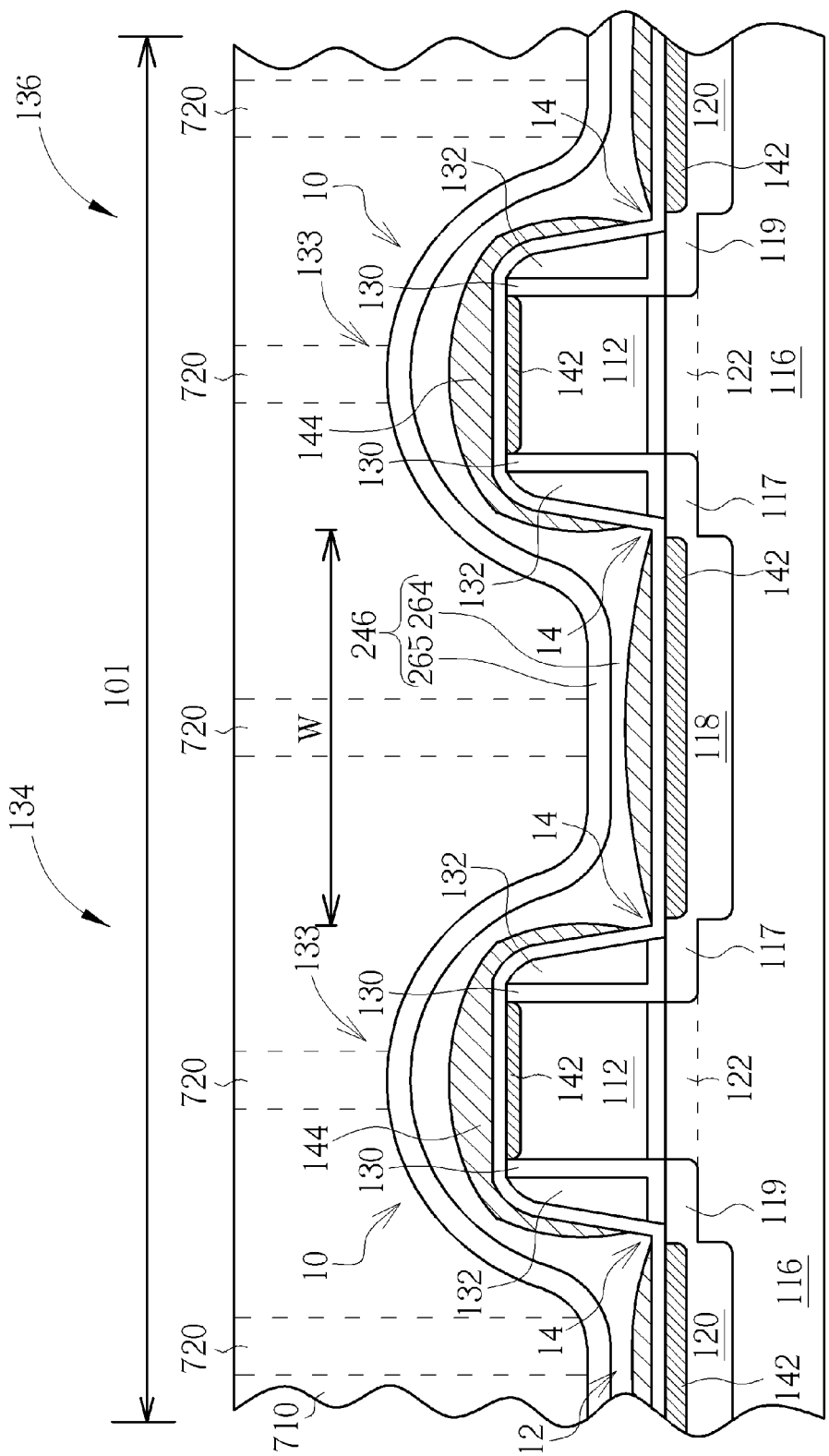
FIG. 7 is schematic cross-sectional diagram showing a MOSFET according to another embodiment of the present invention.

Based on the embodiments in the preceding paragraphs, at least a transistor device is obtained and the top of the transistor device is covered by the first tensile stress layer 144 and a second tensile stress layer 146, 246. The following fabricating processes, such as the deposition process of an interlayer dielectric (ILD), the formation of contact holes inside the ILD, the fabrication of conductive plugs and so forth may further be carried out. After that, the gate electrode 112, each of the source regions 118 and each of the drain regions 120 are able to be electrically connected to the conductive material in the contact holes. During the processes for forming the contact holes inside the ILD, the second tensile stress layer 146, 246 may act as a contact etch stop layer (CESL). When the surface of the second tensile stress layer 146 is exposed by the corresponding etching process, the process parameters can be adjusted so as to form contact holes in the ILD. Additionally, the metal silicide layers 142 in the gate electrode 112, each of the source regions 118 and each of the drain regions 120 may also be formed after the formation of the contact holes, if required. And as shown in FIG. 7, contacts 720 may be formed inside an ILD and the position of the contacts 720 are respectively corresponding to that of the gate electrodes 112, the source regions 118 and the drain regions 120. Since the above-mentioned processes can be understood easily by those skilled in this art, the detailed description of these processes is therefore omitted.

One feature of the present invention resides in that a first tensile stress layer includes a curved portion 10 encompassing each of the gate structures 133, at least an extension portion 12 located on a semiconductor substrate 166 at sides of gate structures 133, and a transition portion 14 between the curved portion 10 and the extension portion 12, wherein the first tensile stress layer 144 has a non-uniform thickness gradually thinning from the curved portion 10 and the extension portion 12 to the transition portion 14. The transition portions 14 could be a continuous or a non-continuous (broken) based on requirements.

Furthermore, the present invention may be combined with other suitable fabricating processes so as to broaden the application in the field of the semiconductor industry. For example, the present invention may also adopt the stress memorization technique (SMT), which is described in detail as below.

Figure 8:
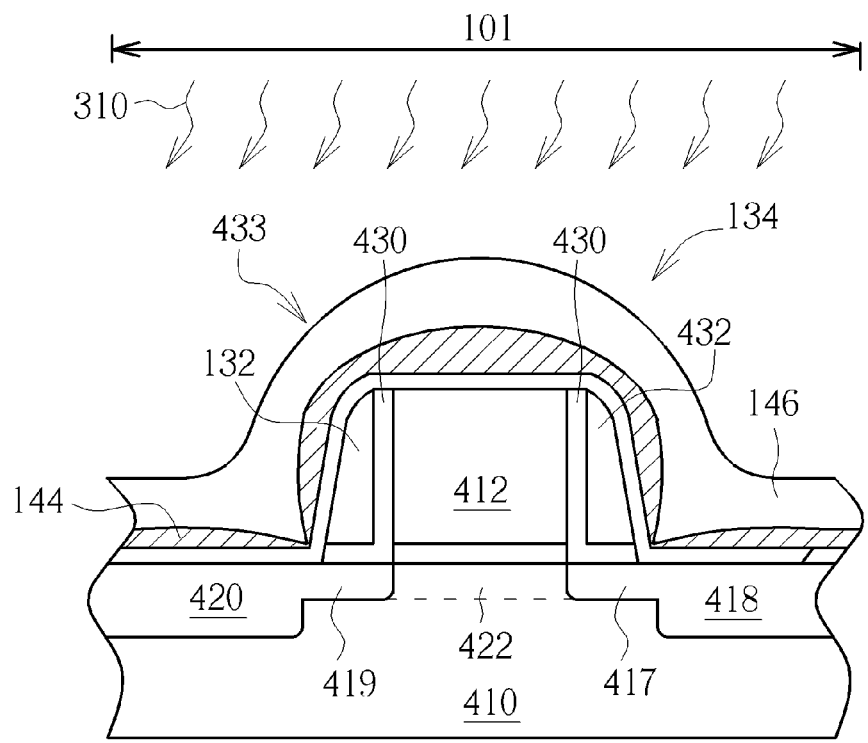
FIGS. 8-11 are schematic diagrams showing a method of fabrication a MOSFET according to other embodiments of the present invention.

Please refer to FIG. 8, which is a schematic diagram showing a MOSFET according to one embodiments of the present invention and can also be regarded as a structure following the process shown in FIG. 1. The subject matter in this embodiment is similar to the MOSFET 134 in the first transistor region 101 shown in FIG. 1, and for the sake of clarity, same number numerals are used to designate similar parts. According to one embodiment of this invention, after the formation of the drain region 420 and the source region 418, the semiconductor substrate 410 is subjected to a pre-amorphization implant (PAI) process. Afterward, amorphized layers are formed separately in the drain region 420 and in the source region 418. According to other embodiments, the PAI process may be carried out before the formation of the drain region 420 and the source region 418, or the amorphized layers may be formed at the time when the implantation processes for forming the drain region 420 and the source region 418 are carried out. Subsequent, at least a CVD process and a annealing process 310 are carried out to forma first tensile stress layer 144 and a second tensile stress layer 146 sequentially, which can conformally cover the drain region 420, the source region 418 and the gate structure 433 (including a gate electrode 412, a gate dielectric layer 414, a lining layer 430 and spacers 432). By implementing the annealing process 310 with a high enough temperature, like 1000° C., the semiconductor substrate 410 treated with PAI process can memorize the stress that the first tensile stress layer 144 and a second tensile stress layer 146 imparts thereto. Similarly to the embodiments described above, due to the gradually thinning morphology of the first tensile stress layer 144, the stress in the stress layers 144, 146 can be imparted into a channel region and enlarge the interstitial space therein more effectively. Based on various requirements, the first tensile stress layer 144 and the second tensile stress layer 146 may optionally be removed completely and the processes shown in FIGS. 2-7 can be repeated again.

Figure 9:
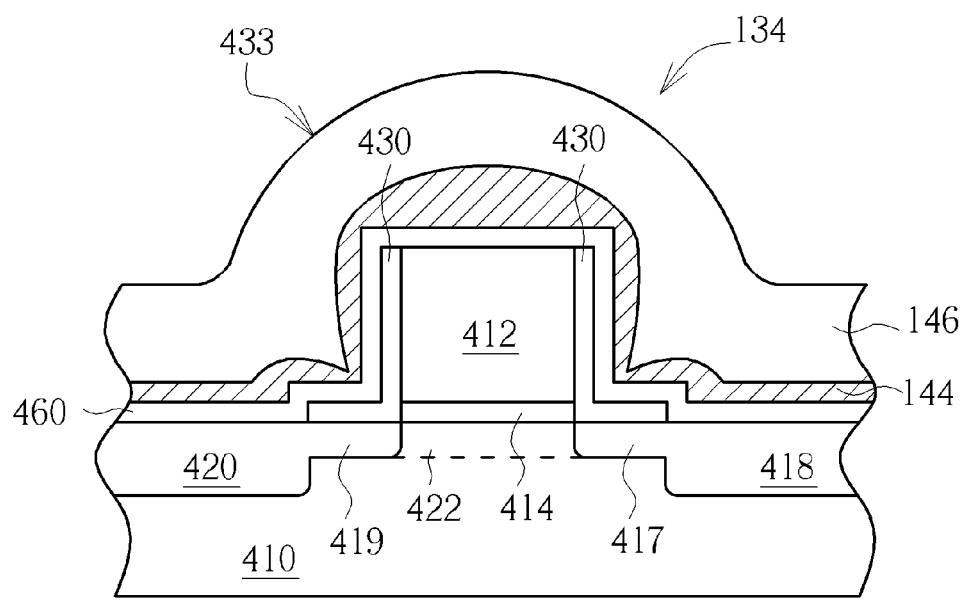
Figure 10:
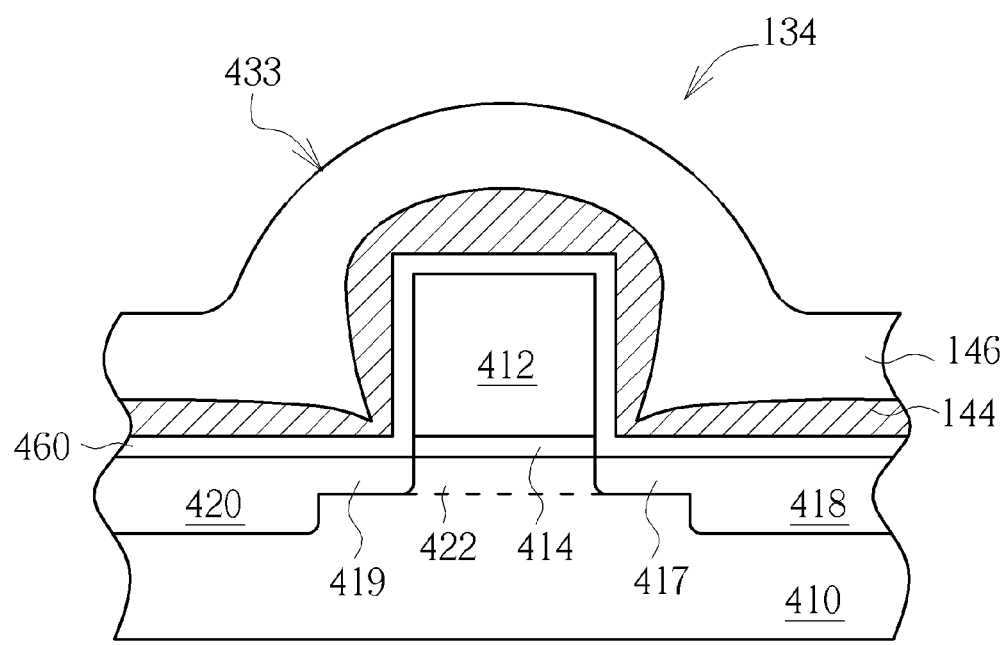

According to another embodiment of the present invention, the lining layer and spacers can be optionally stripped away before the first tensile stress layer is deposited, that is to say, the first tensile stress layer or the lining layer underlying the first tensile stress layer can cover gate structures directly without spacers. Please refer to FIG. 9 and FIG. 10. FIG. 9 is a schematic cross-sectional diagram illustrating a MOS transistor in accordance with a third embodiment of the present invention, and FIG. 10 is a schematic cross-sectional diagram illustrating a MOS transistor in accordance with a fourth embodiment of the present invention, wherein similar numbers designate similar parts, regions or elements. For the sake of clarity, the MOSFET 134 in the first transistor region 101 shown in FIG. 1 is chosen as a subject matter in this embodiment.

As shown in FIG. 9, according to the third embodiment of the invention, the spacers 432 can be optionally stripped away before the lining layer 460 or the first tensile stress layer 144 are deposited so that only the liner 430 having an L-shape is maintained on the sidewall of the gate 412. Subsequently, similar to the processes shown in FIGS. 2-5, the lining layer 460, the first tensile stress layer 460 with gradually shrinking structure and the second tensile stress layer 146 are formed sequentially so at to complete the structure shown in the third embodiment. Since the lining layer 460 directly covers the surface of the gate structure 433 containing no spacer, the second tensile stress layer 146 can affect the MOSFET 134 more effectively. Furthermore, as shown in FIG. 10, the spacers 432 and the liner 430 can even be completely removed, so only a gate structure 412 containing no spacer or liner remains.

Figure 11:
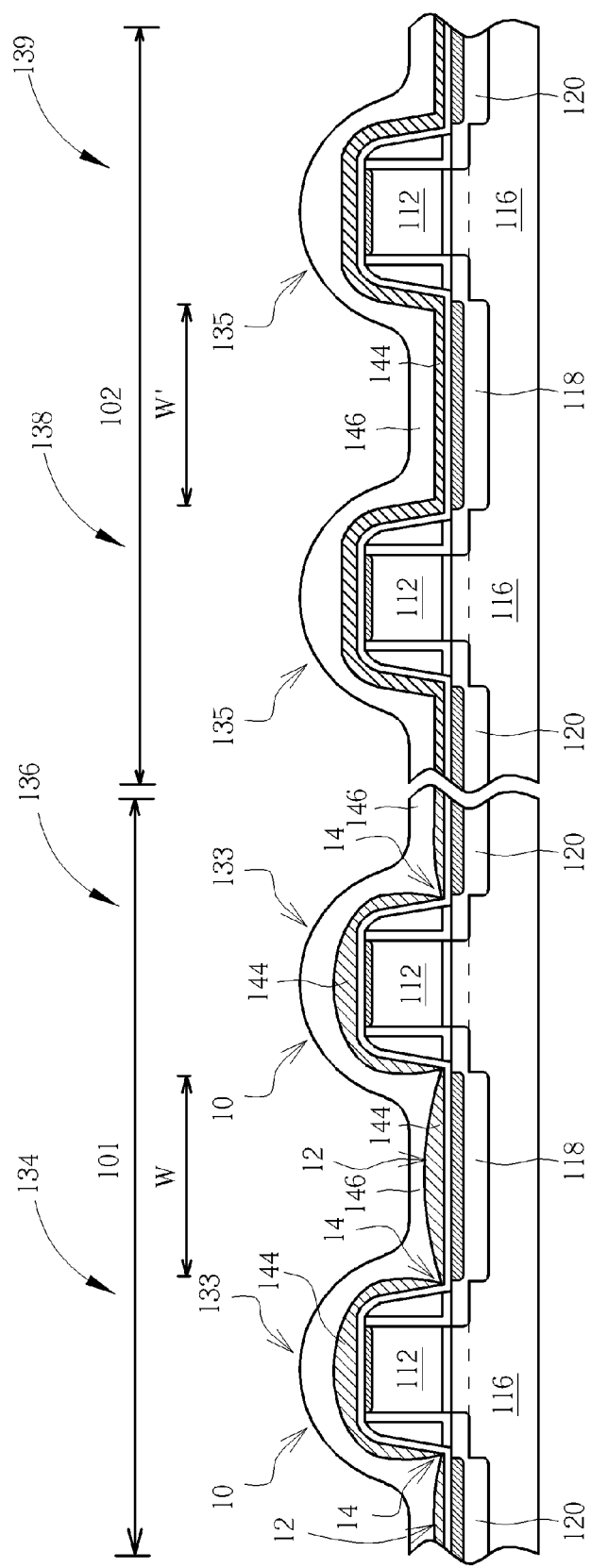

In each of the embodiments described above, the semiconductor substrate may further include a second transistor region. As shown in FIG. 11, the semiconductor substrate 116 further includes a second transistor region 102, whereat least two gate structures are disposed, such as two MOSFETs 138 and 139. In this embodiment, the main difference between the first transistor region 101 and the second transistor region 102 is that the two adjacent gate structures 135 within the second transistor region 102 have a relatively large width W', which may be larger 100 nm for example. Since the first tensile stress layer 144 is deposited on the entire semiconductor substrate 116, the first tensile stress layer 144 within the second transistor region 102 can also encompass the corresponding gate structures 135 and cover the source regions 118 and the drain regions 120. Since the two adjacent gate structures 135 within the second transistor region 102 have a relatively large width W', the first tensile stress layer 144 within the second transistor region 102 therefore has a uniform thickness, i.e. without shrinking morphology. That is to say, even though the first tensile stress layer 144 is deposited in the first transistor region 101 and the second transistor region 102 through the same fabricating parameters and the same annealing process, the thickness of the first tensile stress layer 144 within the second transistor region 102 still has no gradually decreasing or broken feature appearing in the first transistor region 101. In this way, through different width between the two adjacent gate structures 133 or 135, MOSFETs with similar carrier type, such as N-type, can still achieve different performances even though a stress layer disposed thereon has an equal stress value. This embodiment may be carried out along with the above-described embodiments, such as selectively removing the spacers and liners, performing the silicidation process after the formation of the contact holes and so forth.

To summarize, one feature of the present invention is that a first tensile stress layer within a first transistor region 101 includes a curved portion 10 encompassing each of gate structures 133, at least an extension portion 12 located on a semiconductor substrate 166 at sides of gate structures 133, and a transition portion 14 between the curved portion 10 and the extension portion 12, wherein the first tensile stress layer 144 has a non-uniform thickness gradually thinning from the curved portion 10 and the extension portion 12 to the transition portion 14. And the transition portion 14 could be a continuous layer or a non-continuous (broken) layer. If other layers (such as the second tensile stress layer 146) with certain tensile stress values are formed and cover the first tensile stress layer 144, according to the natural property of dynamics, the corresponding tensile stress may be concentrated on the transition portion 14; furthermore, since the transition portions 14 are at two ends of each of the channel regions 122, the direction of the net stress applied on each channel region 122 can be almost parallel to that of the channel regions 122 so that the interstitial space in the channel regions 122 can be enlarged more effectively. There is no need to utilize a stress layer with over high stress value, such as stress value beyond 1.52 Gpa, thereby avoiding the fracture of the stress layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a transistor with a non-uniform stress layer, comprising:
   providing a semiconductor substrate having a first transistor region;
   forming at least a transistor comprising a gate structure within the first transistor region;
   performing a low temperature deposition process to form a first tensile stress layer on the transistor, wherein a temperature of the low temperature deposition process is lower than 300 degrees Celsius (° C.), wherein the first tensile stress layer comprises a curved portion encompassing the gate structure, at least an extension portion with a curved top surface located on the semiconductor substrate at sides of the gate structure, and a transition point between the curved portion and the extension portion, and wherein the first tensile stress layer has a thickness gradually thinning from the curved portion and the extension portion toward the transition point and a thinnest thickness of the first tensile stress layer is defined by the transition point and an external corner of the gate structure and the semiconductor substrate;
   after performing the low temperature deposition process, performing a high temperature annealing process, wherein a temperature of the high temperature annealing process is at least 150° C. higher than a temperature of the low temperature deposition process; and
   forming a second tensile stress layer on the first tensile stress layer, wherein the first tensile stress layer has a tensile stress lower than a tensile stress of the second tensile stress layer.

2. The method according to claim 1, wherein the first tensile stress layer is a continuous layer before the step of performing the high temperature annealing process.

3. The method according to claim 1, wherein the first tensile stress layer is a non-continuous layer after the step of performing the high temperature annealing process.

4. The method according to claim 3, wherein the second tensile stress layer is in direct contact with two sides of a lower portion of the gate structure.

5. The method according to claim 1, wherein the semiconductor substrate further comprises a second transistor region, the method further comprising:
   forming at least two gate structures within the second transistor region, wherein a gap with a width wider than 100 nanometer (nm) is located between the two adjacent gate structures; and
   forming the first tensile stress layer conformally encompassing the gate structures and filling into the gap, wherein the first tensile stress layer within the second transistor region is a continuous layer.

6. The method according to claim 1, before the step of forming the first tensile stress layer on the transistor, the method further comprising:

forming a silicon oxide layer to encompass the gate structure and to cover the semiconductor substrate at sides the gate structure.

7. The method according to claim 1, wherein the transistor is an N-type metal-oxide-semiconductor field effect transistor (MOSFET).

8. A method of fabricating a transistor with a non-uniform stress layer, comprising:

providing a semiconductor substrate having at least a gate structure thereon;

forming a source region and a drain region separately located in the semiconductor substrate on two sides of the gate structure; and forming a first tensile stress layer and a second tensile stress layer respectively, wherein at least a factor for forming the first tensile stress layer is different from a factor for forming the second tensile stress layer, wherein the factor excludes a processing time and the first tensile stress layer has a thinnest thickness defined by a transition portion and a corner between the gate structure and the semiconductor substrate compared to other portions of the first tensile stress layer, and a stress of the second stress layer is concentrated on the transition portion.

9. The method according to claim 8, wherein the tensile stress of the second tensile stress layer is higher than a tensile stress of the first tensile stress layer.

10. The method according to claim 8, wherein the second tensile stress layer is in direct contact with two sides of a lower portion of the gate structure.

11. The method according to claim 8, wherein the factor comprises pressure, temperature, gas concentration and depositing power.

12. The method according to claim 8, wherein the first tensile stress layer further comprises a curved portion encompassing the gate structure and at least an extension portion located on the semiconductor substrate at sides of the gate structure, the transition portion is between the curved portion and the extension portion, and a thickness of the first tensile stress layer is gradually thinning from the curved portion and the extension portion toward the transition portion.

\* \* \* \* \*